US009054045B2

(12) United States Patent
Posseme et al.

(10) Patent No.: US 9,054,045 B2
(45) Date of Patent: Jun. 9, 2015

(54) METHOD FOR ISOTROPIC ETCHING

(71) Applicants: COMMISSARIAT A L'ENERGIE ATOMIQUE ET AUX ENE ALT, Paris (FR); Applied Materials, Inc., Santa Clara, CA (US)

(72) Inventors: Nicolas Posseme, Grenoble (FR); Gene Lee, San Jose, CA (US)

(73) Assignees: Commissariat a l'energie atomique et aux energies alternatives, Paris (FR); Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/142,028

(22) Filed: Dec. 27, 2013

(65) Prior Publication Data

US 2014/0187050 A1 Jul. 3, 2014

(30) Foreign Application Priority Data

Dec. 28, 2012 (FR) ...................................... 1262954

(51) Int. Cl.
*H01L 21/308* (2006.01)
*H01L 21/311* (2006.01)
*H01L 21/3213* (2006.01)

(52) U.S. Cl.
CPC ........ *H01L 21/3086* (2013.01); *H01L 21/3081* (2013.01); *H01L 21/31122* (2013.01); *H01L 21/31144* (2013.01); *H01L 21/32139* (2013.01)

(58) Field of Classification Search
CPC combination set(s) only.
See application file for complete search history.

(56) References Cited

U.S. PATENT DOCUMENTS

| | | | | |
|---|---|---|---|---|
| 2003/0091938 | A1* | 5/2003 | Fairbairn et al. | 430/314 |
| 2005/0064718 | A1* | 3/2005 | Yin et al. | 438/723 |
| 2007/0123050 | A1 | 5/2007 | Zhou et al. | |
| 2009/0212010 | A1* | 8/2009 | Wang et al. | 216/47 |

OTHER PUBLICATIONS

French Preliminary Search Report and Written Opinion issued Aug. 16, 2013, in Patent Application No. FR 1262954, filed Dec. 28, 2012 (With English Translation of Category of Cited Documents).

* cited by examiner

*Primary Examiner* — Duy Deo
*Assistant Examiner* — Erin Bergner
(74) *Attorney, Agent, or Firm* — Oblon, McClelland, Maier & Neustadt, L.L.P.

(57) ABSTRACT

According to one embodiment, the invention relates to a method for the anisotropic etching of patterns in at least one layer to be etched through a hard mask comprising carbon in an inductive-coupling plasma etching reactor (ICP), the method being characterized in that the hard mask is made from boron doped with carbon (B:C), and in that, prior to the anisotropic etching of the patterns in said layer to be etched through the hard mask of carbon-doped boron (B:C), the following steps are performed:
realization of an intermediate hard mask situated on a layer of carbon-doped boron intended to form the hard mask made from carbon-doped boron (B:C),
etching of the layer of carbon-doped boron (B:C) through the intermediate hard mask in order to form the hard mask made from carbon-doped boron (B:C),
the realization of the intermediate hard mask and the etching of the hard mask made from carbon-doped boron (B:C) being done in said inductive coupling plasma etching reactor (ICP).

18 Claims, 3 Drawing Sheets

METHOD FOR ISOTROPIC ETCHING

TECHNICAL FIELD OF THE INVENTION

The present invention concerns in general the techniques of etching used in microelectronics and more particularly those based on the use of a hard mask in a plasma etching reactor.

PRIOR ART

The constant reduction of the dimensions of the patterns that it is necessary to be able to etch in order to produce ever denser integrated circuits has been able to be maintained only by constantly improving the techniques of photolithography and etching of the layers of materials used to realize the electronic integrated circuits. Whereas the families of integrated circuits or technological "nodes" now reach sizes of a few tens of nanometers (nm=$10^{-9}$ meters), it is necessary to be able to extend the decrease in dimensions beyond the technological nodes that have succeeded each other in the past years: 90, 65 and 45 nm up to the node currently in production in the most recent lines, that is to say 32 nm.

Thus, in order to reach the above decananometric dimensions, recourse is now usually had to the use, in photolithography, of a "hard mask" (HM), which refers to the use of an intermediate layer in order to be able to etch the smallest patterns with good definition. Whereas for a long time photosensitive resists served directly as a mask, after the development of patterns and insolation, in order to etch these in the materials forming the integrated circuits, the most usual ones of which are silicon (Si) and the oxide thereof ($SiO_2$), the first step is now usually to etch the patterns in a layer of a material constituting the hard mask.

This technique has in particular become necessary since the etching itself has greatly changed. Whereas for a long time it was carried out in a wet environment, that is to say by putting the surfaces to be etched in contact with a suitable chemical solution, the procedure is now usually to carry out ionic bombardment etching using a plasma formed in an etching chamber. This is because wet etchings are essentially isotropic. The etching extends both in depth and under the resists then serving as a mask. After the reduction of the dimensions of the patterns to the decananometric dimensions mentioned above, it becomes impossible, with this type of etching, to respect the critical dimensions (CDs) of the devices to be produced. The shape factor of the patterns to be etched has in fact changed enormously over the years of development. The constant increase in the density of the circuits is obtained essentially with a reduction in geometry of the patterns whereas the thicknesses of the layers in which they are formed have not varied, by far, in the same proportion. It has therefore been necessary to have recourse to a type of etching that is highly anisotropic. This is what is enabled by etching in a plasma. The bombardment of the ions being essentially perpendicular to the surfaces to be etched, there is then, under optimum conditions of implementation, little or no lateral attack of the materials to be etched, and the critical dimensions can be achieved.

The use of an anisotropic plasma etching does however, in practice involve the use of a hard mask since the selectivity of attack of this type of etching according to the materials on which it acts is unfortunately much lower than what can be obtained with wet etchings. In order to continue to directly use photosensitive resists as a mask it would in fact be necessary to deposit them in very thick layers so that they are not entirely consumed at the end of the etching, which is then incompatible with the definition of critical dimensions (CDs) in these resins.

The solution consists in realizing a hard mask in a material sufficiently resistant to plasma etching and into which the patterns to be etched are first of all transferred. Traditionally, with technological nodes from that of 90 nm, the material most often used by the microelectronics industry to realize a hard mask is carbon. However, as will be seen in the description of FIGS. 1a and 1b, the new reductions in dimensions necessary to implement the technological nodes in the course of development, that is to say those beyond 32 nm, means that this material and the associated etching technique are no longer suitable because of the hard-mask deformations found during the implementation of the traditional method.

One object of the invention is therefore to provide an etching solution that is compatible with the technological nodes currently being developed and with the industrial requirements in terms of production rate.

The other objects, features and advantages of the present invention will appear from an examination of the following description and accompanying drawings. Naturally other advantages may be incorporated.

SUMMARY OF THE INVENTION

According to one embodiment, the invention relates to a method for the anisotropic etching of patterns in at least one layer to be etched, comprising for example a semiconductor material, through a hard mask in an inductive-coupling plasma (ICP) etching reactor. The hard mask is made from carbon-doped boron (B:C). Prior to the anisotropic etching of the patterns in the layer to be etched through the carbon-doped boron (B:C) hard mask, the following steps are performed:

realization of an intermediate hard mask situated on a layer of carbon-doped boron intended to form the hard mask made from carbon-doped boron (B:C), etching of the layer of carbon-doped boron (B:C) through the intermediate hard mask in order to define said patterns in the hard mask made from carbon-doped boron (B:C).

Advantageously, the realization of the intermediate hard mask and the etching of the hard mask made from carbon-doped boron (B:C) are carried out in said inductive-coupling plasma (ICP) etching reactor.

It has been found that the use of such a carbon-doped boron hard mask in an inductive-coupling plasma reactor makes it possible to reduce the mask distortions that occur with the solutions using a carbon mask, makes it possible to carry out a highly anisotropic etching of said layer to be etched and makes it possible to perform all the steps in the same reactor, which increases productivity. It turns out that the selectivity in the etching of the carbon-doped boron mask is significantly higher that the selectivity in the etching of a carbon mask. Thus, during the etching of said layer to be etched, the carbon-doped boron mask is consumed much less quickly, typically at a third of the rate, than a carbon mask. As a result the thickness of the carbon-doped boron mask may be reduced compared with a carbon mask while carrying out an etching of said layer to be etched that is highly anisotropic. It has been observed that the defects that normally occur with carbon masks, such as the folding of the thin carbon patterns, appear all the more easily, the greater the thickness of the carbon mask. The invention, by making it possible to reduce the thickness of the mask through which said layer to be etched is etched, therefore reduces the defects appearing at the mask.

According to another embodiment, the invention relates to a method for the anisotropic etching of patterns and at least one layer to be etched comprising a semiconductor material through a hard mask in an inductive-coupling plasma etching reaction, the method being characterized in that the hard mask is made from carbon-doped boron (B:C).

According to an advantageous but non-limitative embodiment, prior to the anisotropic etching of the patterns in said layer to be etched through the carbon-doped boron (B:C) hard mask, the following steps are performed in said inductive-coupling plasma (ICP) etching reactor:
- realization of an intermediate hard mask situated on a layer of carbon-doped boron,
- etching of the layer of carbon-doped boron (B:C) through the intermediate hard mask in order to form the hard mask made from carbon-doped boron (B:C).

BRIEF DESCRIPTION OF THE FIGURES

The aims and objects as well as the features and advantages of the invention will emerge more clearly from the detailed description of an embodiment of the latter that is illustrated by the following accompanying drawings, in which.

Figure 1A:
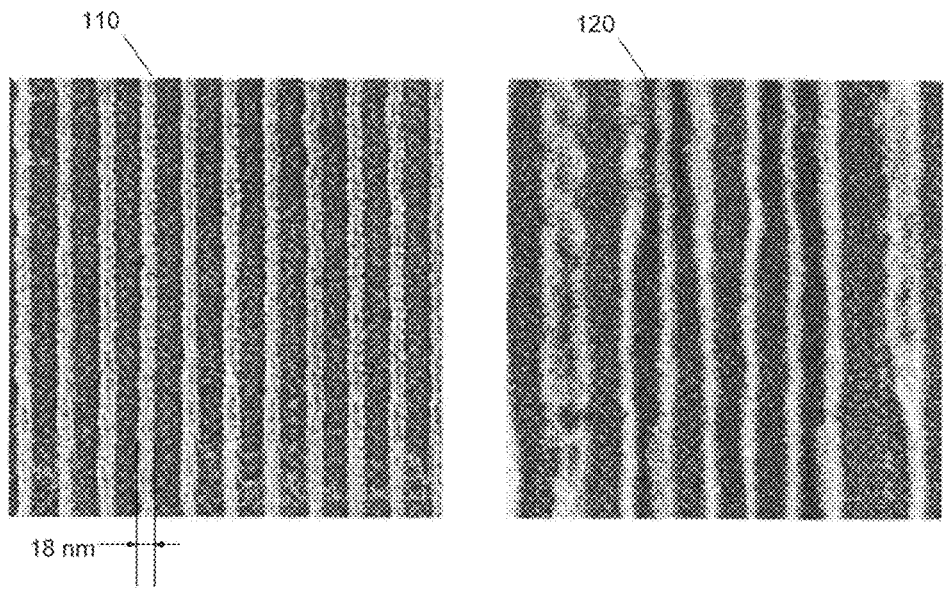
FIGS. 1a and 1b illustrate the problems posed by the use of a carbon hard mask for technological nodes beyond 32 nm.

The drawings are given by way of examples and are not limitative of the invention. They constitute schematic outline representations intended to facilitate understanding of the invention and are not necessarily to the scale of practical applications. In particular, the relative thicknesses of the various layers are not representative of reality.

DETAILED DESCRIPTION OF THE INVENTION

In the context of the present invention, the term "on", "surmounts" or "underlying" or the equivalents thereof do not necessarily mean "in contact with". Thus, for example, the deposition of a first layer on a second layer does not necessarily mean that the two layers are directly in contact with each other but means that the first layer at least partially covers the second layer while being either directly in contact therewith or being separated therefrom by another layer or another element.

In the context of the present invention, a hard mask usually means a mask realised from a material that is not eliminated when resist masks normally used in the art are eliminated. A hard mask is differentiated from a polymer mask or a mask formed by a layer of resist which, after development, makes it possible to transfer patterns into a layer that underlies it. The hard mask is disposed between the resist mask and the layer to be etched. A hard mask is normally an inorganic mask. It is conventionally referred to as a hard mask.

Before beginning a detailed review of embodiments of the invention, optional features that may optionally be used in association or alternatively are given below:

Advantageously, the etching of the carbon-doped boron (B:C) hard mask is carried out in a plasma made from species comprising: chlorine ($Cl_2$), argon (Ar), a gas based on oxygen and a fluorinated gas. Preferably, the plasma comprises only these species.

Advantageously, the chlorine ($Cl_2$) is introduced at a rate ranging from 2 to 300 sccm and preferably 5 to 200 sccm.

Preferably, the argon (Ar) is introduced at a rate ranging from 300 to 700 sccm and preferably approximately 500 sccm.

Preferably, the oxygen-based gas is taken among: oxygen ($O_2$), sulphur dioxide ($SO_2$) or carbon oxysulphide (COS). Preferably, the oxygen-based gas is oxygen ($O_2$). It is preferably introduced at a rate ranging from 10 to 80 sccm and preferably 20 to 60 sccm.

Advantageously, the fluorinated gas is taken among: nitrogen trifluoride ($NF_3$) or sulphur hexafluoride ($SF_6$). Preferably, the fluorinated gas is introduced at a rate ranging from 3 to 50 sccm and preferably 5 to 30 sccm.

Advantageously, the thickness of the hard mask made from carbon-doped boron ranges from 1 to 5 times the depth of the patterns etched in said layer to be etched.

Advantageously, in the hard mask made from carbon-doped boron, the proportion of carbon ranges from 15% to 60% and preferably 20% to 50%, which improves selectivity.

According to an embodiment, in the hard mask made of carbon-doped boron, the proportion of bore is ranging from 20% to 60%.

According to an embodiment, the hard mask is made of boron (B), carbon (C) and hydrogen (H). The proportion of boron (B) is between 20% and 60% and preferably between 40% and 55%. The proportion of carbon (C) is between 15% and 60% and preferably between 20% and 50%. The proportion of hydrogen (H) is between 5% and 40% and preferably between 10% and 30%. These proportions are molar proportions.

According to an embodiment, the hard mask is made of boron (B), carbon (C) and hydrogen (H) and wherein the proportion of bore is 50%, the proportion of hydrogen is 20%, the proportion of carbon is 30%.

The hard mask is inorganic.

Advantageously, the intermediate hard mask is made from an oxide. Preferably, the intermediate hard mask is made from silicon dioxide ($SiO_2$) or nitrided silicon oxide as $SiO_xN_y$.

According to one embodiment, the realization of the intermediate hard mask comprises an etching of the intermediate layer in a fluorocarbon plasma. Preferably, the etching of the intermediate layer to form the intermediate hard mask is carried out in a fluorocarbon plasma based on carbon tetrafluoride ($CF_4$) or octafluorobutane ($C_4F_8$), trifluoromethane ($CHF_3$) and oxygen.

Advantageously, the realization of the intermediate hard mask comprises an etching of the intermediate layer through a resist mask situated on the intermediate layer.

According to one embodiment, said layer to be etched is made from a semiconductor material taken among silicon, germanium or silicon-germanium. According to another embodiment, said layer to be etched comprises an oxide of a semiconductor material taken for example among silicon, germanium or silicon-germanium.

Preferably, prior to the realization of the intermediate hard mask, a stacking of layers is realized comprising at least said layer to be etched on which there are successively disposed: the layer of carbon-doped boron; an intermediate layer, preferably made from an oxide, wherein the intermediate hard mask is intended to be realised; a layer of resist, preferably photosensitive.

Preferably, the intermediate layer is disposed directly in contact with the layer of resist. Preferably, the intermediate layer is disposed directly in contact with the layer of carbon-doped boron. Preferably, the layer of carbon-doped boron is disposed directly in contact with said layer to be etched.

As seen in the section on the prior art, the current methods for manufacturing integrated circuits usually have recourse to the use of hard masks made from carbon. This material is deposited in liquid form by centrifugation or by chemical vapour method using a so-called PECVD technique, the acronym for "plasma-enhanced chemical vapour deposition". By photolithography, the patterns to be etched, for example the interconnection lines and the contact holes serving to form the vias, are next transferred into the carbon layer. The method is used for the so-called "BEOL" fabrication steps, the acronym for "back-end of line", that is to say the operations at the end of the fabrication line where, at relatively low temperature, not exceeding 450° C., all the interconnections are made between the active components. The method is also used for the definition of the patterns of the active components, the transistors, during operations termed "FEOL", the acronym for "front-end of line", which refers to the operations at the start of the production line where the highest temperatures must be applied during these preliminary steps of producing the components. The manufacture of particularly dense devices such as electronic memories also has recourse to the use of hard masks for etching.

Figure 1B:
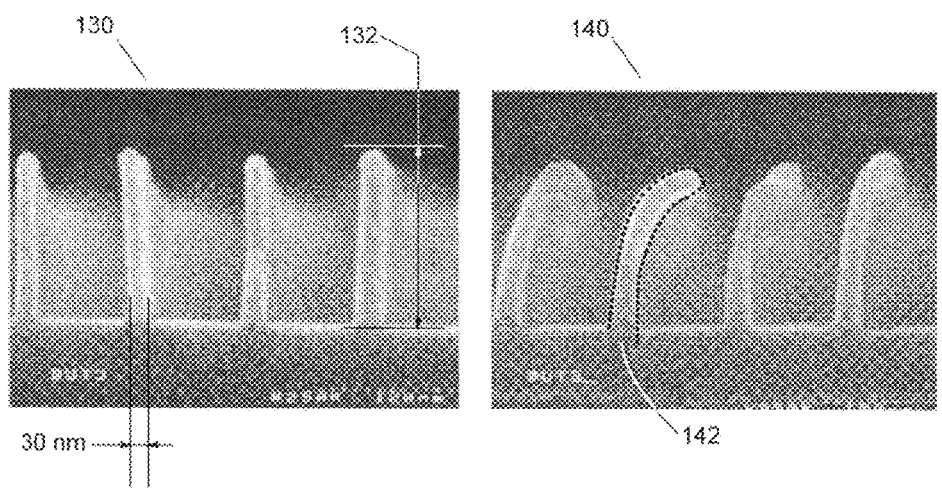

However, as shown in FIGS. 1a and 1b for technological nodes beyond 32 nm, distortions in the hard mask can be observed, which are produced by the operations that follow the transfer of the patterns into the carbon layer. Following the steps of the manufacturing method where the hard mask is used, it may then be necessary to carry out, for example, a wet cleaning using solutions based on hydrofluoric acid (HF) or an etching operation using chemistry in a plasma based on fluorocarbon (FC) products. These operations prove to be particularly disturbing for the patterns of the hard mask, the shape factor (height/width) of which increases greatly because of the reduction in the size of the patterns that it is necessary to be able to etch and because of the thickness that the mask must necessarily have in order not to be entirely consumed during etching.

FIG. 1a shows first a plan view 110 produced with an electronic microscope of an example of a hard mask after opening of the patterns in the carbon layer. In this example the lines of the mask have, as indicated, a width of 18 nm and are regularly spaced apart after opening. FIG. 1a shows 120 moreover the same lines after a wet cleaning operation has been carried out. It can be seen that the lines of the hard mask are then seriously disturbed and have become unusable. FIG. 1a corresponds to the case of an etching operation performed during FEOL steps and a hard mask disposed on a layer of silicon. In this example the thickness of the carbon layer is 70 nm, which gives a highly accentuated shape ratio of the patterns (70/38), which explains why they can be easily deformed.

FIG. 1b shows first a view in section 130 of a hard mask after opening of the patterns in the carbon layer 132. FIG. 1b shows secondly the same view in section 140 after exposure to an etching plasma based on fluorocarbon products mentioned above. This example illustrates the etching operations wherein the interconnections are realized between components during so-called BEOL steps. It is a case for example of etching in a porous dielectric material, the dielectric constant of which is low, trenches that will then be filled with copper according to the so-called damascene method in order to obtain interconnections with a low time constant. It will be noted that the carbon patterns of the hard mask, which have in this example a width of 30 nm, have greatly bent 142 on themselves after exposure to the fluorocarbon plasma because of their shape factor, which has become very unfavourable owing to the reductions in the horizontal dimensions of the patterns to be etched. This bending of the patterns of the mask can be termed "line bending".

One solution to the problems disclosed in the above figures would be to be able to reduce the thickness of the hard mask made from carbon in order to obtain a shape factor of the patterns that is more favourable to the mechanical strength thereof during operations that follow the formation thereof. However, as seen in the section on the prior art, plasma etchings are characterized by a lower selectivity of attack of the materials exposed to etching than that obtained with wet etchings. There is consumption of the hard mask during etching and it is not possible to reduce the thickness of carbon, which has already been fixed at the minimum value compatible with this etching mode.

To respond to these problems, the invention proposes to use a material other than carbon. This material is boron (B) doped with carbon (C). It turns out that this material offers much better selectivity in attack in plasma etching than carbon. Hereinafter denoted B:C, carbon-doped boron typically offers a gain in selectivity by a factor of three compared with a standard hard mask made from carbon alone. It therefore makes it possible to considerably reduce the thickness of hard mask necessary for the transfer of the patterns and then to reduce the shape factor of the patterns of the mask in the same proportions. The thickness of the mask can then be reduced, which makes it possible to reduce or even prevent the folding of the fine patterns of the mask on themselves.

This type of material (B:C) can for example be deposited by PECVD. The etching of the hard mask itself, that is to say the prior transfer of the patent in the mask, can be done by means of fluorocarbon chemistry in a plasma formed in an etching reactor referred to as CCP, the acronym for "capacitive coupled plasma".

However, it is often advantageous to etch the materials underlying the mask in a so-called ICP reactor, the acronym for "inductive coupled plasma". A change in reactor during the operation would pose numerous problems because of the manipulations to be performed, which would be difficult to make compatible with implementation of the method on an industrial level. Such a change would in any event give rise to great slowing of the rate of the production line if it had to be implemented. It is therefore important to be able to transfer the patterns into the carbon-doped boron hard mask in the same reactor as the one serving to then etch the underlying functional layers, that is to say in an inductive-coupling plasma reactor.

As already mentioned above, chemical etching using fluorocarbon products of the carbon tetrafluoride ($CF_4$) or octafluorobutane ($C_4F_8$) type would allow etching of the B:C in a CCP reactor. It has however been found that it is impossible to use such chemistry in an ICP reactor since the rate of dissociation of the FC gaseous species, under the impact of the fast electrons of the plasma, is insufficient in an ICP reactor compared with a CCP reactor. In the case of an ICP reactor, the passivation layer that normally forms on the edges of the etched patterns and laterally protects these throughout the etching is not sufficiently great. Since the edges are no longer, or insufficiently, protected, this gives rise to an isotropic etching of the mask made from carbon-doped boron (B:C), which is highly prejudicial to the definition of the critical dimensions (CD), as seen in the section on the prior art.

Before the present invention, there therefore did not exist any solution for obtaining an anisotropic etching in an ICP reactor, without deformation of the mask and without having to change reactor in order to carry out the etching of the mask and the etching of the underlying layer. However, this is for example essential for mastering the definition of the critical dimensions of the hard mask in particular for etching structures of the lines/spaces type as illustrated in FIGS. 1a and 1b.

FIGS. 2a to 2d describe the steps of an example of an etching method according to the invention that makes it possible for an anisotropic etching of the patterns of a hard mask made from carbon-doped boron (B:C) to be able to be done in an inductive-coupling (ICP) etching reactor.

Figure 2A:
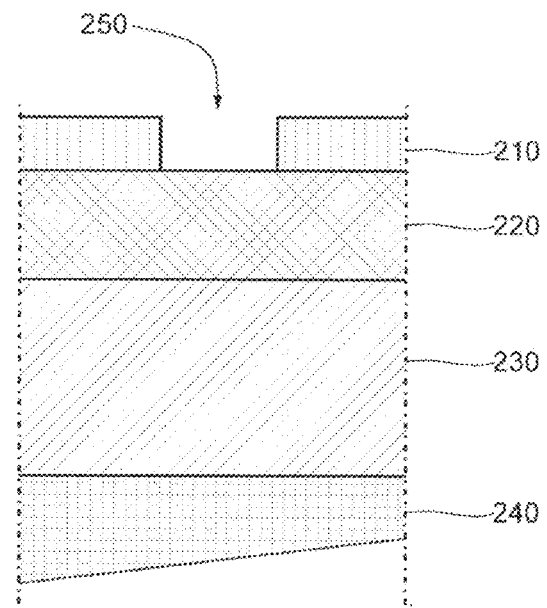
FIGS. 2a to 2d illustrate the steps of an example of the method according to the invention wherein an anisotropic etching of the patterns of a carbon-doped boron (B:C) hard mask is carried out in an inductive-coupling (ICP) etching reactor.

FIG. 2a describes the result of the first step, wherein, by photolithography, patterns are transferred in a conventional fashion into a layer of photosensitive resin 210 that is disposed above the layers to be etched 240 and the layers that will form the hard mask: 220 and 230. The invention makes provision in fact for using two layers of hard mask: one layer 230 made from carbon-doped boron (B:C) as discussed above. This layer is itself covered with a layer 220 intended to form a first hard mask, also referred to as the intermediate hard mask 2200.

The layer 220 is advantageously formed by an oxide. Advantageously it is formed by a silicon dioxide ($SiO_2$) or a nitrided silicon oxide of the $SiO_xN_y$ type, generally denoted SiON.

According to the invention, the patterns 250, initially transferred into the resin 210, will then be etched successively in the above various layers. Advantageously, all the following etchings are carried out in the same plasma etching reactor of the ICP type, that is to say inductive coupling.

Figure 2B:
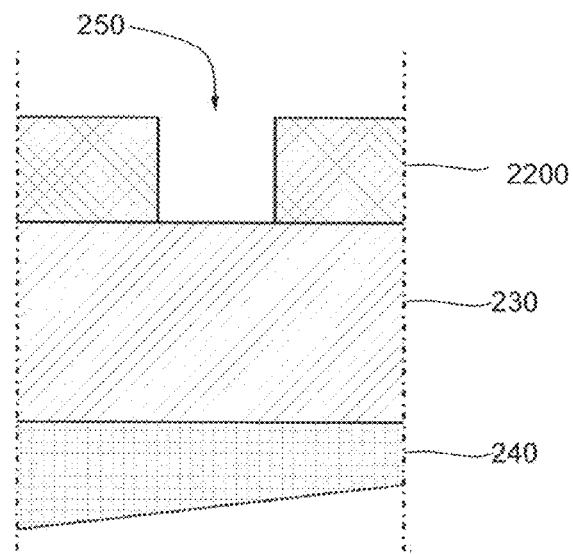

FIG. 2b shows the result of the etching in the ICP reactor of the layer 220 in which the intermediate hard mask 2200 made from oxide ($SiO_2$ or SiON) is realized and after removal of the layer of resist 210.

The etching of this intermediate layer before the realization of the carbon-doped boron hard mask 2300 is necessary since the etching of this hard mask 2300 through the layer of resist 210 is not sufficiently selective. This is because, if the layer 230 of carbon-doped boron were etched directly through the resist mask 210, the latter would be too greatly consumed to define small patterns in the layer 230 of carbon-doped boron.

The etching of the layer 220 is done in a conventional manner using fluorocarbon chemistry well known to persons skilled in the art. It uses etching products of the $CF_4/CHF_3/O_2$ type, that is to say respectively carbon tetrafluoride, trifluormethane and oxygen.

The thickness of the layer of oxide 220 is typically adjusted in a range of values from 30 nm to 100 nm. The layer 220 is all the thicker, the thicker the underlying layer 230, made from B:C.

Figure 2C:
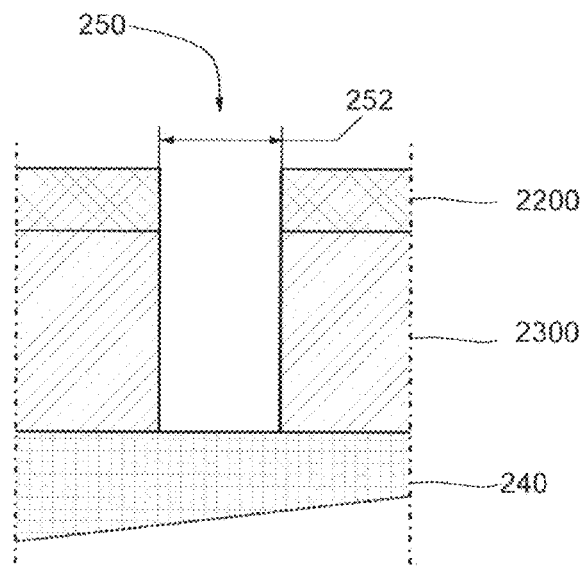

FIG. 2c shows the result of the etching carried out in the ICP reactor and through the intermediate hard mask 2200 obtained at the end of the step described in FIG. 2b. This etching is applied to the second layer 230 in order to form the hard mask 2300 of carbon-doped boron (B:C).

A preferred composition of the material is 50% boron, 20% hydrogen, 30% carbon. More generally, the amount of boron can vary between 20% and 60% and preferably between 40% and 55%. The proportion of carbon is between 15% and 60% and preferably between 20% and 50%. The proportion of hydrogen is between 5% and 40% and preferably between 10% and 30%.

The material is deposited by PECVD, that is to say plasma enhanced chemical vapour deposition. The concentration of boron makes it possible to act on the selectivity during the etching of the layer 240.

With these percentages and in particular this proportion of boron, it has been found that the mask has a significantly improved resistance to etching. This increases the selectivity and thus the precision of the etching.

The hydrogen originates from the reaction of formation of the mask which is typically obtained through the reaction of BxHy elements with CzHm elements to provide BaCbHc, where x, y, z, m, a, b, c are the molar proportions of each element in the composition.

The greater the concentration of boron, the better will be the selectivity, that is to say this will make it possible to etch the layer 240 more quickly than the layer 230 forming the hard mask 2300.

In the present description the proportions are molar proportions.

The thickness of the layer 230 of carbon-doped boron is typically adjusted in a range of values ranging from 50 nm to 400 nm. As mentioned above, if the layer 230 is thick, for example 400 nm, it is chosen to have a layer of oxide 220 ($SiO_2$ for example) that is also thick, for example 100 nm.

In general these thicknesses are chosen so that there is not total consumption of the intermediate hard mask 2200 during the etching of the carbon-doped boron hard mask 2300. Thus, the thickness to be etched in the layer 240 determines the thickness of the material 2300 to be etched, which itself determines the thickness of the material 2200.

The etching of the layer 230 made from B:C is done anisotropically in the ICP reactor under the conditions described below. It should be noted here that the method is adaptable whatever the thickness of the B:C material used and whatever the dimensions 252 of the patterns to be etched, which can vary within a wide range of values ranging from around 10 millimeters to several hundreds of nanometers.

The chemistry used in the ICP etcher to obtain this result is of the $Cl_2/Ar/O_2$ type, that is to say chlorine/argon/oxygen. The oxygen can be replaced by sulphur dioxide ($SO_2$) or carbon oxisulphide (COS). And there is also an addition of a fluorinated gas of the $NF_3$ or $SF_6$ type for example, that is to say respectively nitrogen trifluoride or sulphur hexafluoride.

The above species, in gaseous form, are used under the conditions summarised in the following table. These conditions are only an example of implementation and are not limitative. The rates are measured in sccm, the acronym for standard cubic centimeters per minute, under standard conditions of temperature and pressure.

| Species: | Rate in sccm: | Conditions: |
|---|---|---|
| Chlorine $Cl_2$ | 5 to 200 | The role of the chlorine is to passivate the flanks by formation of C—Cl species. The chlorine is an element also serving for etching the B:C material. An excess of chlorine may give rise to an excessively steep profile and an |

|  | Rate in sccm: | Conditions: |
|---|---|---|
|  |  | excessive consumption of the intermediate hard mask made from SiON and $SiO_2$. |
| Oxygen $O_2$ | 20 to 60 | The oxygen affords a gain in selectivity compared with the SiON or $SiO_2$ hard mask and makes it possible to etch the B:C material ten times less quickly than with chlorine. However, an excess of oxygen in the $O_2/Cl_2$ ratio may give rise to a phenomenon of micromasking. Then high roughness is obtained. Gases based on oxygen such as COS or $SO_2$ may replace oxygen. The quantities of $SO_2$ and COS used are similar to those of oxygen. |
| Fluorinated chemistry $SF_6$ or $NF_3$ | 5 to 30 | The fluorine makes it possible to control the profile and to etch the B:C material. Too much chlorine does however give rise to a loss of selectivity vis-à-vis the hard mask and gives isotropic profiles. With fluorine alone, that is to say without $Cl_2$, a completely isotropic etching is then obtained since there is no longer any formation by the chlorine of the passivation layer on the flanks, the formation of the C—Cl species mentioned above no longer taking place. |
| Argon Ar | 500 | The role of the argon is to facilitate the dissociation of the species of the plasma. |
| Electrical powers in watts: |  |  |
| Source | 100-1000 | The source power makes it possible to act on the dissociation of the plasma. |
| Bias | 50-500 | The bias makes it possible to increase the rate of etching of the B:C material. However, an excessively high bias power give rise to a loss of selectivity and steep profiles because of the redeposition of the etching reaction products on the flanks of the patterns. On the other hand, a low bias power improves the selectivity vis-à-vis the $SiO_2$ or SiON hard mask but there is then no formation of a sufficient passivation layer on the flanks and isotropic profiles are obtained. |
| Other parameters: |  |  |
| Pressure | 5-100 millitorrs |  |
| Temperature | 10-100° C. |  |
| Etching time |  | From around thirty seconds to a few minutes. The etching time depends on the thickness to be etched. |

It can be seen in the above table that the etching of the mask 230 of carbon-coped boron (B:C) is therefore a compromise between the ratio of the gases $Cl_2/O_2/F$ that make it possible to obtain anisotropic profiles and sufficient selectivity vis-à-vis the intermediate hard mask 2200 made from $SiO_2$ or SiON.

For example, the optimum conditions for etching a layer made from B:C, with a thickness of 150 nm, are: source power, 500 W; bias power, 100 W; pressure, 20 millitorrs; $O_2$ rate, 35 sccm, $Cl_2$ rate, 15 sccm; Ar rate, 200 sccm, $SF_6$ rate, 10 sccm; etching time 80 seconds.

The etching chemistry for etching the layer 240 depends on its composition. For example, if this layer is silicon, the etching chemistry can be: $SF_6$ rate, 35 sccm; $CH_2F_2$ rate, 25 sccm; He rate, 200 sccm; $N_2$ rate, 45 sccm; bias power 60 W; source power 450 W; pressure 6 millitorrs.

In more general terms, said layer to be etched is made using a semiconductor material taken among silicon, germanium or silicon-germanium or is made using an oxide from a semiconductor material taken among silicon, germanium or silicon-germanium.

Figure 2D:
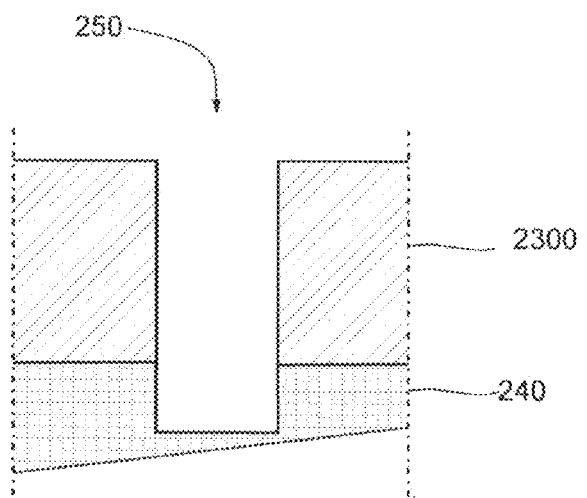

FIG. 2d illustrates the etching of the patterns 250 in the layers to be etched 240. In many cases, these layers will be functional layers. Possibly but not limitatively, they may be realised in all the materials normally used in microelectronics and in particular those issuing from silicon, such as polycrystalline silicon, silicon oxide, silicon-germanium or germanium, etc. In the context of the invention, the etching is done by means of the hard mask 2300 made from carbon-doped boron, which can be much less thick than the traditional hard masks made from carbon, thus avoiding the problems of deformation described with reference to FIGS. 1a and 1b. It should be noted that the layer 220 forming the first mask 2200 is partially consumed during the etching of the layer 230 and is completely consumed at the end of the etching of the layer 240. The invention is not limitative of certain specific functional layers.

The invention is not limited to the embodiments previously described and extends to all embodiments covered by the claims.

The invention claimed is:

1. A method for anisotropic etching of a pattern in at least one layer to be etched through a hard mask comprising carbon in an inductively-coupled plasma etching reactor, the method comprising:
   etching an intermediate layer to obtain an intermediate hard mask situated on a hard mask layer comprising carbon-doped boron, then
   etching the hard mask layer comprising carbon-doped boron through the intermediate hard mask to form a hard mask comprising carbon-doped boron, and then
   anisotropically etching the at least one layer to be etched, wherein:
   the etching of the hard mask layer comprising carbon-doped boron is performed in a plasma comprising chlorine ($Cl_2$), argon (Ar), an oxygen-based gas and a fluorinated gas, and the etching of the intermediate layer and the etching of the hard mask layer comprising carbon-doped boron are both performed in the inductively-coupled plasma etching reactor.

2. The method according to claim 1, wherein the chlorine ($Cl_2$) is introduced at a flow rate ranging from 2 to 300 sccm.

3. The method according claim 1, wherein the argon (Ar) is introduced at a flow rate ranging from 300 to 700 sccm.

4. The method according to claim 1, wherein the oxygen-based gas is: oxygen ($O_2$), sulfur dioxide ($SO_2$) or carbon oxysulfide (COS).

5. The method according to claim 1, wherein the oxygen-based gas is oxygen ($O_2$) and is introduced at a flow rate ranging from 10 to 80 sccm.

6. The method according to claim 1, wherein the fluorinated gas is: nitrogen trifluoride ($NF_3$) or sulfur hexafluoride ($SF_6$).

7. The method according to claim 6, wherein the fluorinated gas is introduced at a flow rate ranging from 3 to 50 sccm.

8. The method according to claim 1, wherein a thickness of the hard mask layer comprising carbon-doped boron is ranging from 1 to 5 times a depth of the pattern etched in the at least one layer to be etched.

9. The method according to claim 1, wherein, in the hard mask layer comprising carbon-doped boron, the proportion of carbon is from 20% to 50%.

10. The method according to claim 1, wherein, in the hard mask layer comprising carbon-doped boron, the proportion of boron is from 20% to 60%.

11. The method according to claim 1, wherein the hard mask layer comprising carbon-doped boron further comprises hydrogen, and wherein the proportion of boron is between 20% and 60%, the proportion of carbon is between 15% and 60%, and the proportion of hydrogen is between 5% and 40%.

12. The method according to claim 1, wherein, the hard mask layer comprising carbon-doped boron further comprises hydrogen, and wherein the proportion of boron is 50%, the proportion of hydrogen is 20%, and the proportion of carbon is 30%.

13. The method according to claim 1, wherein the intermediate hard mask comprises an oxide.

14. The method according to claim 1, wherein the etching of the intermediate layer comprises etching the intermediate layer in a fluorocarbon plasma comprising trifluoromethane ($CHF_3$), oxygen, and at least one compound selected from the group consisting of carbon tetrafluoride ($CF_4$) and octofluorobutane ($C_4F_8$).

15. The method according to claim 1, wherein the etching of the intermediate layer comprises etching the intermediate layer through a resist mask located on the intermediate layer.

16. The method according to claim 1, wherein the layer to be etched comprises a semiconductor material selected from the group consisting of silicon, germanium and silicon-germanium, or comprises an oxide of a semiconductor material selected from the group consisting of silicon, germanium and silicon-germanium.

17. The method according to claim 1, wherein the hard mask layer comprising carbon-doped boron is directly in contact with the layer to be etched and the intermediate layer, and a layer of resist is disposed on the intermediate layer.

18. A method for anisotropic etching of a pattern in at least one layer to be etched through a hard mask comprising carbon in an inductively-coupled plasma etching reactor, the method comprising:

etching an intermediate layer to obtain an intermediate hard mask situated on a hard mask layer comprising carbon-doped boron, then etching the hard mask layer comprising carbon-doped boron through the intermediate hard mask to form a hard mask comprising carbon-doped boron, and then anisotropically etching the at least one layer to be etched, wherein:

the etching of the intermediate layer and the etching of the hard mask layer comprising carbon-doped boron are both performed in the inductively-coupled plasma etching reactor.

* * * * *